United States Patent [19]

van der Putten

[11] Patent Number: 5,017,516

[45] Date of Patent: May 21, 1991

[54] METHOD OF MANUFACTURING A SEMICONDUCTOR DEVICE

[75] Inventor: Andreas M. T. P. van der Putten, Eindhoven, Netherlands

[73] Assignee: U.S. Philips Corporation, New York, N.Y.

[21] Appl. No.: 475,616

[22] Filed: Feb. 2, 1990

[30] Foreign Application Priority Data

Feb. 8, 1989 [NL] Netherlands ............................ 8900305

[51] Int. Cl.[5] ........................................... H01L 31/288
[52] U.S. Cl. ...................................... 437/230; 427/304; 427/305
[58] Field of Search ................. 427/304, 305; 437/230

[56] References Cited

U.S. PATENT DOCUMENTS

| | | | |
|---|---|---|---|
| 3,415,679 | 10/1968 | Chuss | 437/230 |
| 3,993,799 | 11/1976 | Feldstein | 427/305 |
| 4,297,393 | 10/1981 | Denning et al. | 427/305 |
| 4,321,283 | 3/1982 | Patel et al. | 437/230 |
| 4,419,390 | 12/1983 | Feldstein | 427/305 |
| 4,634,468 | 1/1987 | Gulla et al. | 427/303 |
| 4,692,349 | 9/1987 | Georgiou et al. | 427/305 |
| 4,804,410 | 2/1989 | Haga et al. | 427/304 |

*Primary Examiner*—Brian E. Hearn
*Assistant Examiner*—Trung Dang

[57] ABSTRACT

By using a nucleating solution having a low concentration of $PdCl_2$ at an increased temperature, contact holes can be nucleated in a selective manner and, subsequently, metallized in an electroless bath, said contact holes being etched by means of plasma etching in dielectric layers of VLSI devices having a silicon semiconductor body.

8 Claims, 1 Drawing Sheet

METHOD OF MANUFACTURING A SEMICONDUCTOR DEVICE

BACKGROUND OF THE INVENTION

The invention relates to a method of manufacturing a semiconductor device comprising a dielectric layer in which contact holes are etched, after which electrically conductive plugs are formed in said contact holes by means of an electroless metallization bath, said plugs contacting a silicon-containing semiconductor material.

Semiconductor devices, in particular integrated circuits (ICs), comprise a large number of transistors and other components (capacitors, resistors) which are interconnected electrically. Metal-oxide semiconductor-field effect transistors (MOSFETs) are used on a large scale in VLSI (very large scale integration) devices. In this application, the source and drain regions of a silicon substrate are provided with metal contact plugs which are formed in etched contact holes in a thin $SiO_2$ layer on the silicon substrate. By means of an aluminum conductor pattern which is provided by means of vacuum evaporation or sputtering the metal plugs and, hence, the individual transistors are interconnected. As the dimensions become smaller (submicron technology) sputtering or vacuum evaporation of, for example, aluminum is unsuitable for the metallization of contact holes. A suitable method is formed by electroless metallization, in which metal is selectively separated from an aqueous solution of metal ions and a reducing agent and deposited into the contact holes.

Such a method is known from U.S. Pat. No. 4,692,349. In the method described in patent specification, this substrates containing titanium silicide, tantalum silicide or cobalt silicide are coated with a dielectric layer. Holes are etched in the dielectric layer which are subsequently metallized in an electroless nickel or cobalt bath so as to form contact plugs. As stated in the said Patent Specification, said method is not suitable for the metallization of a silicon substrate because of the poor adhesion of nickel or cobalt to silicon.

SUMMARY OF THE INVENTION

One of the objects of the invention is to provide a method of manufacturing a semiconductor device as described in the opening paragraph, which is suitable for selectively metallizing contact holes on silicon substrates.

According to the invention, this object is achieved by a method as described in the opening paragraph, which is characterized in that the contact holes are etched by means of plasma etching, and that the electroless metallization operation is preceded by a treatment at a temperature between 40° and 95° C. in an aqueous nucleating solution containing HF and between $5 \cdot 10^{-4}$ and 0.14 mmol of a palladium salt per liter.

DETAILED DESCRIPTION OF THE INVENTION

Figure 1A:
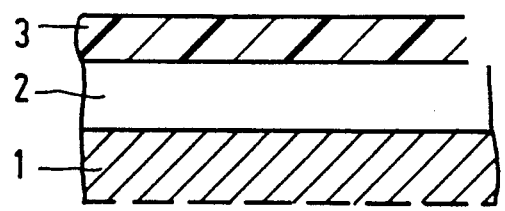
FIGS. 1a-1f are diagrammatic views of the formation of a semiconductor device during various steps of a method of the invention.

Suitable palladium salts are $PdCl_2$, $PdSO_4$, $Pd(NO_3)_2$ and Pd acetate.

The action of the nucleating solution is based on an exchange reaction between the very noble metal Pd and the base metal Si:

$$Si + 2Pd^{2+} \rightarrow Si^{4+} + 2Pd$$

Pd nuclei which are catalysts for the subsequent electroless metallization step are formed on the silicon surface.

The dielectric layer in which the contact holes are etched consists generally of $SiO_2$. Alternatively, other dielectric layers such as $Si_3N_4$, Spin-on-glass (PTEOS: polytetraethoxysilane) and synthetic resins such as polyimide can be used.

No exchange reaction takes place between these dielectric materials and Pd, so that only the bottom of the contact hole is covered with Pd nuclei. Only the surfaces which are covered with Pd nuclei are metallized in the electroless bath. In this manner, the contact holes can be metallized selectively by means of the proposed nucleating solution.

It has been found that for the metallization of contact holes having very small dimensions (diameter approximately 1 $\mu$m, depth approximately 1 $\mu$m) it is necessary that the particle density of the Pd nuclei be high and that the dimensions of the Pd nuclei be small. The known nucleating solutions do not satisfy this requirement.

In an article by L. A. D'Asaro et. al. in J. Electrochem. Soc. 127 (1980) 1935–1940 a description is given of a nucleating solution containing 0.33 g of $PdCl_2$ (1.9 mmol) per liter which solution deposits small Pd nuclei (50–100 Å) with a high particle density ($10^{12}$ per $cm^2$) on GaAs substrates. On silicon substrates, however, relatively few and coarse Pd nuclei are formed (500–2000 Å; particle density $10^{10}$ per $cm^2$).

In an article by B. K. Singh et. al. in J. Electrochem. Soc. 127 (1980) 2578–2580 a description is given of a nucleating method in which the silicon to be metallized is treated, in succession, with a $SnCl_2$ solution and a $PdCl_2$ solution. Observations carried out by Applicants have shown that by means of this method sufficiently fine Pd nuclei are obtained; the method, however, is not selective relative to dielectric materials such as $SiO_2$, $Si_3N_4$, PTEOS and synthetic resins. Therefore, this method is unsuitable for selectively nucleating silicon with respect to dielectric materials.

By virtue of the combination of a low concentration of palladium salt and an increased temperature of the nucleating solution, the method according to the invention enables Pd nuclei to be formed in large numbers and at high rates, after which said nuclei grow very slowly.

A sufficiently fine nucleation requires a temperature of the nucleating solution of at least 40° C. Owing to the evaporation rate of the solution a practical upper limit is 95° C.

If the concentration of palladium salt in the nucleating solution exceeds 0.14 mmol per liter Pd nuclei are formed which are too coarse. A practical lower limit is $5 \cdot 10^{-4}$ mmol per liter because at lower concentrations nucleation takes place too slowly.

HF is present in the nucleating solution to remove the native oxide film from silicon. The HF concentration is not critical; a practical value ranges between 0.01 and 10% by weight. When the HF content is too small, the native oxide film on silicon is removed to an insufficient degree; too much HF leads to the dielectric layer of $SiO_2$ being adversely affected. The nucleation step may be optionally preceded by a treatment at room temperature in an aqueous solution of 1% by weight of HF.

The contact holes in the dielectric layer have to be etched by means of plasma etching, also termed "dry etching". Variants of plasma-etching methods are, for example, downstream etching, barrel etching, parallel-plate plasma etching, sputter etching and electron cyclotron resonance etching.

A very suitable plasma-etching method is reactive ion etching (RIE), a variant of which is magnetron (enhanced) reactive ion etching (MRIE). In the case of RIE, an argon and fluorino-containing plasma is used, for example, on the basis of a gas mixture of $CHF_3$ and Ar. This etching method enables contact holes to be etched having a small diameter (0.5 to 1 μm) without the problem of underetching. The contact holes thus formed have straight, steep walls, the bottoms formed by the silicon substrate becoming extra active for the subsequent nucleation step.

Plasma-etched silicon has approximately 10–100× more nuclei than unetched silicon.

Owing to the plasma-etching treatment the Si surface is damaged to such an extent that the surface defects formed serve as Pd-nucleation centres. The surface defects may be vacancies or dislocations, but also interstitial H-atoms.

Customary photoresists which are developed after exposure via a suitable shadow mask can be used as the etching mask for the plasma-etching of the dielectric layer. By using the method according to the invention, small Pd nuclei (approximately 200 Å) are selectively formed on the silicon and with a sufficiently high particle density (approximately $10^{11}$ per $cm^2$), and the contact hole to be metallized may have a diameter of approximately 1 μm.

The subsequent metallization step can be carried out using the customary electroless baths such as those used for deposition of nickel, cobalt, gold, palladium, copper or alloys of these metals with other metals such as tungsten,,a properly adhering metal plug being formed in this process.

Instead of silicon substrates such as n-Si, p-Si and polysilicon and amorphous silicon (a-Si:H), silicides such as $TiSi_2$ and $CoSi_2$ can alternatively be metallized by means of the method according to the invention.

The barrier materials which are customarily used in VLSI-devices, such as TiW, W and TiN, can also be metallized by means of the method according to the invention. Although the latter materials are themselves catalysts for electroless metallization, the presence of Pd nuclei will strongly improve the reliability of the metallization because Pd is very active in the initiation of the process. Particularly in the case of VLSI devices, in which millions of contact holes have to be metallized a reliable initiation and metallization is of essential importance.

A preferred embodiment of the method according to the invention is characterized in that a palladium-salt concentration of $2.8 \cdot 10^{-2}$ mmol per liter is used, the temperature of the nucleating solution being 70° C. In such a treatment, Pd nuclei of approximately 200 Å and a particle density of $10^{11}$ per $cm^2$ are formed in 1 minute.

Another preferred embodiment of the method according to the invention is characterized in that an alkali-free acidic nickel bath is used as the electroless metallization bath. An advantage of such acidic nickel bath relative to basic nickel bath is that the nickel layer deposited exhibits lower internal stresses which leads, inter alia, to an improved adhesion.

Alkali-free nickel baths have the additional advantage that the surface of the deposited nickel layer has a smooth appearance. This is particularly advantageous when a silicon wafer contains contact holes of unequal depth. Such differences in depth may occur as a result of differences in layer thickness in the dielectric layer or as a result of the construction of the semiconductor device. When a deep contact hole is fully metallized, the metal layer will grow beyond the dielectric layer in less deep contact holes. In the case of customary nickel baths the surface of the nickel layer has a granular structure and the nickel layer grows granularly on the surface of the dielectric layer. These grains exhibit poor adhesion and may readily become detached in the further process steps, thus having a deleterious effect on these steps. Moreover, short-circuits may occur between the contact plugs.

When alkali-free nickel baths are used the plug in a shallow contact hole obtains a smooth semispherical nickel surface. In this manner, the risk of the nickel particles becoming detached and of short-circuits is prevented.

A frequently employed reducing agent in electroless nickel baths is hypophosphite. Apart from nickel, phosphorous is also deposited from these baths. If phosphorous is undesirable because of the semiconductive properties of silicon (by diffusion of P in Si), the metallization operation can be carried out first by means of an electroless nickel bath using hydrazine as the reduction agent. The latter bath yields pure nickel, however, with a worse morphology. After a specific layer thickness is attained by the use of the nickel-hydrazine bath, further metallization is carried out in the above-mentioned alkali-free electroless nickel bath so that the plugs still obtain a smooth surface. In this manner, the favourable material properties of the nickel-hydrazine bath are combined with the excellent morphology of the alkali-free nickel bath.

A suitable embodiment of the method according to the invention is characterized in that silicon is used as the silicon-containing semiconductor material. The silicon used may be n-Si, p-Si or polysilicon. As described hereinabove, the nucleation of silicon using the known nucleation methods is either non-selective or ineffective. By means of the method according to the invention, all customary silicon-containing semiconductor materials can be metallized in a selective and adhesive manner.

The invention will be explained in greater detail by means of exemplary embodiments and with reference to the figures of the drawings:

EXEMPLARY EMBODIMENT 1

Figure 1B:
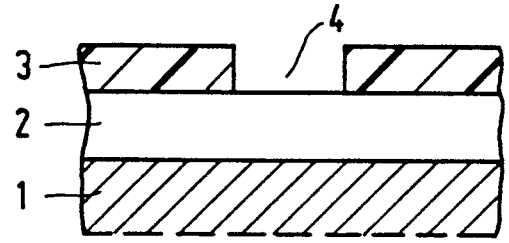
Figure 1C:
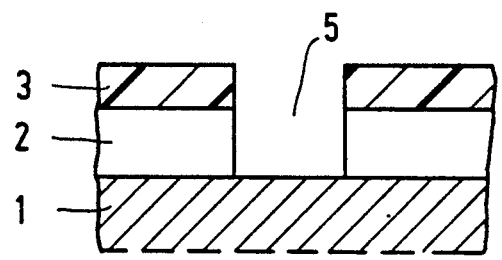
Figure 1D:
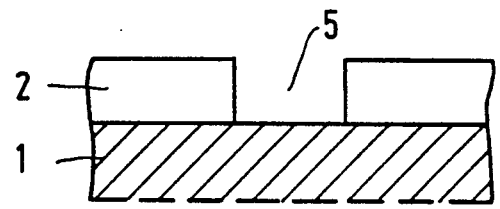

In FIG. 1a, part of a p-silicon substrate, is coated with a 0.7 μm thick layer 2 of $SiO_2$, by means of a customary CVD-process. By means of spinning, a 1.5 μm thick positive photoresist layer 3 (HPR 204 marketed by Hunt) is provided on the $SiO_2$ layer. By means of exposure via a mask and developing, an aperture 4 (FIG. 1b)

is formed in the photoresist layer. Subsequently, a contact hole 5 having a diameter of 1 μm (FIG. 1c) is etched in the SiO$_2$ layer by means of reactive ion etching (RIE). For this purpose, the substrate is placed in a Perkin-Elmer Omni-etch 10,000 reactor. The composition of the gas mixture is 293 sccm (standard cm$^3$ per minute) of Ar, 31 sccm of CF$_4$ and 35 sccm of CHF$_3$. Subsequently, the photoresist layer 3 and the organic residue formed in the RIE-etching operation are removed by means of a O$_2$-plasma Barrel reactor. Next, the substrate is chemically purified in fuming HNO$_3$. The nucleation of the silicon substrate takes place in an aqueous nucleating solution of 70° C. for 1 minute. Said nucleating solution has the following composition:

5 mg of PdCl$_2$ per liter (2.8·10$^{-2}$ mmol)
175 μl of HCl (36% by weight) per liter
1% by weight of HF.

Figure 1E:
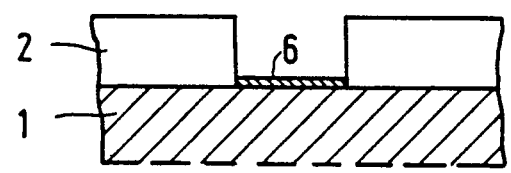
Figure 1F:
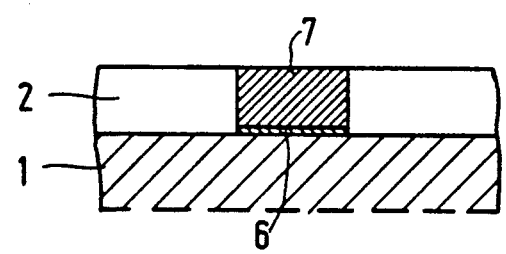

During the nucleation process the solution is stirred. A layer of Pd nuclei 6 (FIG. 1e) having an average particle size of approximately 200 Å and a particle density of approximately 10$^{11}$ per cm$^2$ is formed on the silicon substrate. No Pd nuclei are formed on the SiO$_2$ surface. Subsequently, the contact hole is nickel-metallized, a nickel plug 7 (FIG. 1f) being formed, in a bath having the following composition per liter of water:

20 g of NiCl$_2$ 6H$_2$O
16 g of sodium succinate
10 g of NaH$_2$PO$_2$
2 g of sodium acetate By means of hydrochloric acid, the pH value of the bath is brought to 4.5. The temperature of the bath is 70° C. After 10 minutes, the contact hole has been completely and adhesively metallized. The plugs have a somewhat rough surface and exhibit spherical projections as soon as the nickel surface has reached the edge of the SiO$_2$ surface.

EXEMPLARY EMBODIMENT 2

Figure 2:
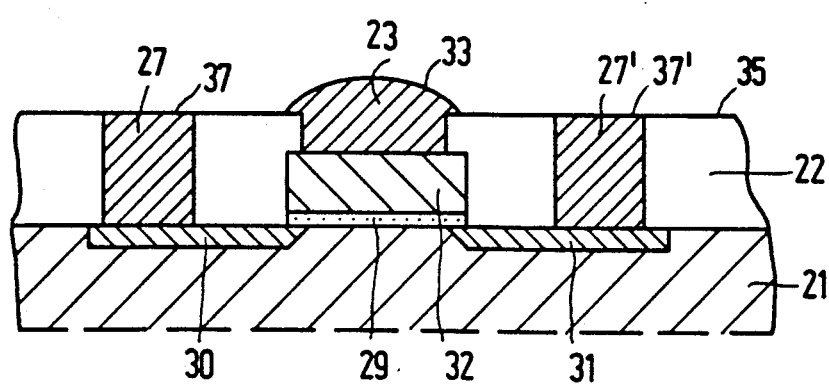
FIG. 2 is a diagrammatic sectional view of a part of a semiconductor device having contact holes of improved depth.

In FIG. 2, reference numerals 27 and 27' denote metallized deep contact holes (plugs) and reference numeral 23 denotes a metallized contact hole (plug) having a smaller depth, as they are used in MOSFET semiconductor devices. Reference numeral 21 denotes a p-Si substrate on which a SiO$_2$ layer 22 is present. Source and drain regions 30 and 31 of n-Si are present in the Si substrate. A thin layer 29 of SiO$_2$ is applied to the Si substrate by means of thermal oxidation. A gate electrode 32 of polysilicon is present on said thermal oxide layer.

Exemplary embodiment 1 is repeated for the manufacture of the plugs 27, 27' and 23, however, a sodium-free and chloride-free electroless nickel bath of the following composition per liter of water being used:
4.3 g of nickel acetate
15.7 g of nickel sulphate
11.7 g of succinic acid
15 g of H$_3$PO$_2$ (50% by weight in water).

By means of ammonia, the pH value is brought to 4.5. The temperature of the bath is 70° C. The metallization process is stopped as soon as the surfaces 37 and 37' of the plugs 27 and 27', respectively, have reached the level of surface 35 of the SiO$_2$ layer 22. When the said nickel bath is used, the plug 23 formed has a smooth, spherical outer surface 33 without any growths or loose nickel particles along the edge of the plug. In this manner, lateral growth of electroless nickel on the surface 35 of the SiO$_2$ layer is suppressed and short-circuits between the plugs 27, 27' and 23 are precluded.

COMPARATIVE EXAMPLE 1

A silicon substrate is subjected to reactive ion etching and nucleated as described in exemplary embodiment 1, however, the temperature of the nucleating solution is 20° C. After dipping in the electroless nickel bath no metallization of silicon takes place. Microscopic examination of the silicon surface prior to the metallization step shows that the Pd nuclei have a particle size of approximately 200 Å, yet the particle density is very low (5·10$^8$ per cm$^2$).

COMPARATIVE EXAMPLE 2

Comparative example 1 is repeated using a nucleating solution which contains 50 mg (instead of 5) of PdCl$_2$ per liter (0.28 mmol per liter) of water, the temperature of the nucleating solution being 20° C. After dipping in the electroless nickel bath no metallization of silicon takes place. Microscopic examination of the silicon surface prior to the metallization step has shown that the Pd nuclei have a particle size of approximately 400 Å, the particle density being approximately 2·10$^9$ per cm$^2$.

COMPARATIVE EXAMPLE 3

Comparative example 1 is repeated using a nucleating solution which contains 50 mg (instead of 5) of PdCl$_2$ per liter (0.28 mmol per liter) of water, the temperature of the nucleating solution being 70° C. In this example, silicon is completely covered with a porous Pd deposit. The particle size is approximately 2000 Å. In this case the substrate is "over activated".

COMPARATIVE EXAMPLE 4

A silicon substrate (monitor wafer) is nucleated in a nucleating solution as described in exemplary embodiment 1. The nucleation step is not preceded by a reactive ion etching treatment. No metallization takes place after dipping in the electroless nickel bath. Microscopic examination of the silicon surface shows that the Pd nuclei have a particle size of approximately 400 Å, the particle density being approximately 5·10$^8$ per cm$^2$.

COMPARATIVE EXAMPLE 5

A silicon substrate (monitor wafer) is subjected to a reactive ion etching treatment. Subsequently, the surface treated is etched in a HF/CrO$_3$ solution, so that approximately 0.5 μm of silicon is removed. Next, the surface is nucleated in a nucleating solution as described in exemplary embodiment 1. After dipping in the electroless nickel bath no metallization takes place. Microscopic examination of the silicon surface shows that the Pd nuclei have a particle size of approximately 400 Å, the particle density being 5·10$^8$ per cm$^2$. Apparently, the activated silicon surface obtained by a reactive ion etching treatment is annihilated by a chemical etching treatment.

Although in the present application a description is given of the metallization of contact holes, thus forming electrically conductive plugs in one single dielectric layer, it will be obvious to those skilled in the art that the said method can also be used to form electrically conductive plugs in multilayer systems to obtain interconnections between superjacent conductor patterns.

I claim:

1. A method of manufacturing a semiconductor device comprising a dielectric layer in which contact holes are etched, after which electrically conductive plugs are formed in the contact holes by means of an electroless metallization bath, said plugs contacting a silicon-containing semiconductor material, characterized in that the contact holes are etched by means of plasma etching and that the electroless metallization operation is preceded by a treatment at a temperature between 40° and 95° C. in an aqueous nucleating solution which contains HF and between $5 \cdot 10^{-4}$ and 0.14 mmol of a palladium salt per liter.

2. A method as claimed in claim 1, characterized in that a palladium-salt concentration of $2.8 \cdot 10^{-2}$ mmol per liter is used, the temperature of the nucleating solution being 70° C.

3. A method as claimed in claim 1, characterized in that an alkali-free acid nickel bath is used as the electroless metallization bath.

4. A method as claimed in claim 1, characterized in that silicon is used as the silicon-containing semiconductor material.

5. A method as claimed in claim 1, characterized in that the contact holes are etched by means of reactive ion etching (RIE).

6. A method as claimed in claim 1, wherein the nucleating solution contains about 0.01-10 wt. % of HF.

7. A method as claimed in claim 3, wherein the silicon-containing semiconductor material is silicon.

8. The method of claim 7, wherein the nucleating solution contains 0.01-10 wt. % of HF.

* * * * *